(12) United States Patent
Kim

(10) Patent No.: US 11,929,410 B2
(45) Date of Patent: Mar. 12, 2024

(54) METHOD FOR FABRICATING HYDROGEN TREATED SURFACE OF SEMICONDUCTOR DEVICE WITH BURIED GATE

(71) Applicant: SK hynix Inc., Gyeonggi-do (KR)

(72) Inventor: Jin Woong Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 328 days.

(21) Appl. No.: 17/211,184

(22) Filed: Mar. 24, 2021

(65) Prior Publication Data

US 2022/0102514 A1 Mar. 31, 2022

(30) Foreign Application Priority Data

Sep. 28, 2020 (KR) .......................... 10-2020-0125733

(51) Int. Cl.
*H01L 21/311* (2006.01)
*H01L 21/8234* (2006.01)
*H01L 29/423* (2006.01)

(52) U.S. Cl.
CPC .... *H01L 29/4236* (2013.01); *H01L 21/31116* (2013.01); *H01L 21/823462* (2013.01); *H01L 29/42368* (2013.01)

(58) Field of Classification Search
CPC ........... H01L 29/4236; H01L 21/31116; H01L 21/823462
See application file for complete search history.

(56) References Cited

U.S. PATENT DOCUMENTS

| 8,558,298 | B2 | 10/2013 | Shinhara | |
|---|---|---|---|---|
| 9,349,858 | B2 | 5/2016 | Hwang et al. | |
| 2005/0041710 | A1* | 2/2005 | Makita | H01S 5/22 372/45.01 |
| 2013/0056823 | A1* | 3/2013 | Kim | H10B 12/09 257/334 |
| 2014/0024201 | A1* | 1/2014 | Kwak | H01L 21/322 438/476 |
| 2014/0063934 | A1* | 3/2014 | Oh | H10B 12/34 365/182 |

* cited by examiner

*Primary Examiner* — Hoai V Pham
(74) *Attorney, Agent, or Firm* — IP & T GROUP LLP

(57) ABSTRACT

A method for fabricating a semiconductor device includes: providing a substrate having a front surface and a rear surface opposite to the front surface; forming a trench in the front surface of the substrate; forming a gate dielectric layer over the trench; forming a gate electrode that fills a bottom portion of the trench over the gate dielectric layer; forming a sealing layer that includes a first portion covering the gate electrode, the gate dielectric layer, and the front surface of the substrate, and a second portion covering the rear surface of the substrate; selectively removing the second portion of the sealing layer; and performing an annealing process to form a hydrogen treated surface on an interface between the trench and the gate dielectric layer.

20 Claims, 6 Drawing Sheets

METHOD FOR FABRICATING HYDROGEN TREATED SURFACE OF SEMICONDUCTOR DEVICE WITH BURIED GATE

CROSS-REFERENCE TO RELATED APPLICATIONS

The present application claims priority to Korean Patent Application No. 10-2020-0125733, filed on Sep. 28, 2020, which is incorporated herein by reference in its entirety.

BACKGROUND

1. Field

Various embodiments of the present disclosure relate to a method for fabricating a semiconductor device, and more particularly, to a method for fabricating a semiconductor device including a buried gate.

2. Description of the Related Art

Unlike the operations of other memory devices, DRAMs require a refresh operation for retaining data to be performed periodically in order to prevent data loss. The refresh operation is an operation in which a sense amplifier reads data from a cell and writes the original value back into the cell. The time taken until the data (stored signal) stored in the cell can be read is called retention time. When the retention time decreases, the refresh cycle is shortened, the power consumption is increased, and the operation rate is decreased.

As semiconductor devices become increasingly more highly integrated, it's becoming difficult to secure the refresh time of a DRAM cell transistor. Thus, new solutions are needed.

SUMMARY

Embodiments of the present disclosure are directed to a method for fabricating a semiconductor device with improved refresh characteristics.

In accordance with an embodiment of the present disclosure, a method for fabricating a semiconductor device includes: providing a substrate having a front surface and a rear surface opposite to the front surface; forming a trench in the front surface of the substrate; forming a gate dielectric layer over the trench; forming a gate electrode that fills a bottom portion of the trench over the gate dielectric layer; forming a sealing layer that includes a first portion covering the gate electrode, the gate dielectric layer, and the front surface of the substrate, and a second portion covering the rear surface of the substrate; selectively removing the second portion of the sealing layer; and performing an annealing process to form a hydrogen treated surface on an interface between the trench and the gate dielectric layer.

In accordance with another embodiment of the present disclosure, a method for fabricating a semiconductor device includes: providing a substrate having a front surface and a rear surface opposite to the front surface, the front surface including an etched surface; forming a sealing layer that includes a first portion covering the front surface of the substrate including the etched surface, and a second portion covering a rear surface of the substrate; removing the second portion of the sealing layer; and performing an annealing process on the rear surface of the substrate to transform the etched surface of the substrate into a hydrogen treated surface.

In accordance with yet another embodiment of the present disclosure, a semiconductor device includes: a substrate having a front surface and a rear surface opposite to the front surface; a trench formed in the front surface of the substrate; a gate dielectric layer formed over the trench; a hydrogen treated surface formed on an interface between the trench and the gate dielectric layer; a gate electrode formed over the gate dielectric layer to fill a bottom portion of the trench; a sealing layer formed over the gate electrode to fill a remaining portion of the trench; and a capping layer that covers the rear surface of the substrate.

DETAILED DESCRIPTION

Figure 1:
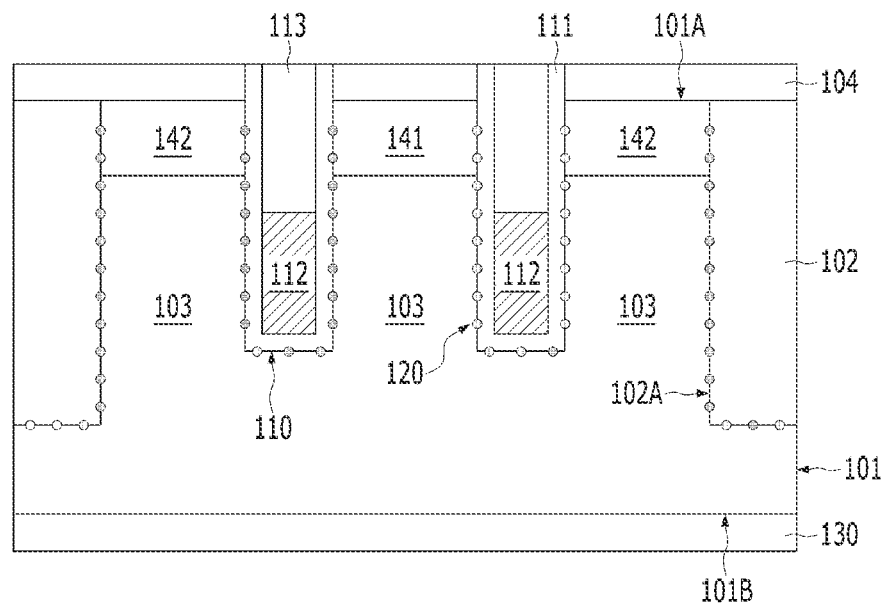
FIG. 1 is a cross-sectional view illustrating a semiconductor device in accordance with an embodiment of the present disclosure.

Various embodiments of the present disclosure will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a cross-sectional view illustrating a semiconductor device in accordance with an embodiment of the present disclosure.

Referring to FIG. 1, the semiconductor device may include a substrate 101 having a front surface 101A and a rear surface 101B. Memory structures may be formed on the front surface 101A as semiconductor processing proceeds. The rear surface 101B is the opposite side to the front surface 101A. The substrate 101 may be a material appropriate for semiconductor processing. The substrate 101 may include a semiconductor substrate. In an embodiment, the substrate 101 may be formed of a silicon-containing material. The substrate 101 may include, for example, silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 101 may also include other semiconductor materials such as germanium. The substrate 101 may include a III/V-group semiconductor substrate, for example, a compound substrate, such as GaAs. In an embodiment, the substrate 101 may include a Silicon-On-Insulator (SOI) substrate.

An isolation layer 102 and an active region 103 may be formed on the front surface 101A of the substrate 101. The active region 103 may be defined by the isolation layer 102. The isolation layer 102 may be a Shallow Trench Isolation (STI) region formed by trench etching. The isolation layer 102 may be formed by filling a shallow trench, for example, an isolation trench 102A, with a dielectric material. The isolation layer 102 may include, for example, silicon oxide, silicon nitride, or a combination thereof.

A trench 110 may be formed over the front surface 101A of the substrate 101. The trench 110 may extend from the front surface into the substrate to a shallower depth than the isolation trench 102A. The trench 110 may not reach the rear surface of the substrate 101. The bottom portion of the trench 110 may have a flat surface as shown in the embodiment of FIG. 1. However, the bottom surface is not limited in this way. For example, the bottom surface of the trench may have a curvature (not shown). The trench 110 may be a space in which the gate electrode 112 is formed. The trench 110 may be referred to as a "gate trench".

A gate dielectric layer 111 may be formed to cover conformally the bottom surface and sidewalls of the trench 110 and the sidewalls of the hard mask layer 104. The gate electrode 112 and a gate sealing layer 113 may then be sequentially stacked over the gate dielectric layer 111 to fill the trench 110. The gate electrode 112 may fill a lower part of the trench 110 while the sealing layer 113 may be formed over the gate electrode to fill an upper part of the trench 110. The gate dielectric layer 111 may include, for example, silicon oxide.

The gate electrode 112 may have a top surface at a lower level than the top surface of the active region 103. The gate electrode 112 may have a shape filling the bottom portion of the trench 110. The gate electrode 112 may be a conductive material. The gate electrode 112 may include, for example, a metal, a metal nitride, or a combination thereof. The gate electrode 112 may include tantalum nitride (TaN), titanium nitride (TiN), tungsten (W), tungsten nitride (WN), or a combination thereof. According to an embodiment, the gate electrode 112 may be formed in a multi-layer structure having different work functions (not shown).

The gate sealing layer 113 may serve to protect the gate electrode 112. The gate sealing layer 113 may fill the upper portion of the trench 110 over the gate electrode 112. The top surface of the gate sealing layer 113 may be positioned at the same level as the top surface of the hard mask layer 104. The gate sealing layer 113 may include a hydrogen trapping material. The gate sealing layer 113 may include, for example, silicon nitride.

The hard mask layer 104 may be formed on both sides of the trench 110 with the gate dielectric layer 111 separating the gate sealing layer 113 from the hard mask layer 104. The hard mask layer 104 may be formed of a dielectric material. The hard mask layer 104 may cover the active region 103 and the isolation layer 102 of the front surface 101A of the substrate 101.

A first doped region 141 and a second doped region 142 may be formed in the active region 103 of the front surface 101A of the substrate 101. The first doped region 141 and the second doped region 142 may be regions doped with a dopant of a conductivity type. For example, the dopant of a conductivity type may include phosphorus (P), arsenic (As), antimony (Sb), or boron (B). The first doped region 141 and the second doped region 142 may be doped with a dopant of the same conductivity type. A first doped region and a second doped region 142 may be positioned in the active region 103 on both sides of the trench 110. The bottom surfaces of the first doped region 141 and the second doped region 142 may be positioned at a predetermined depth from the top surface of the active region 103. The first doped region 141 and the second doped region may contact the sidewalls of the trench 110. The bottom surfaces of the first doped region 141 and the second doped region may be higher than the bottom surface of the trench 110. The first doped region 141 may be referred to as a 'first source/drain region', and the second doped region 142 may be referred to as a 'second source/drain region'. A channel (not shown) may be defined between the first doped region 141 and the second doped region 142 by the gate electrode 112. The channel may be defined along the profile of the trench 110.

A capping layer 130 covering the rear surface 101B may be formed on the rear surface 101B of the substrate. The capping layer may include a hydrogen anti-diffusion material. The capping layer 130 may include, for example, silicon nitride.

In particular, in the present embodiment, a hydrogen treated surface 120 may be formed over the etched surfaces of the front surface 101A of the substrate 101, that is, on the surface of the isolation trench 102A for forming the isolation layer 102 and the surface of the trench 110 for forming the buried gate electrode 112.

The hydrogen treated surface 120 may be formed by implanting deuterium from the rear surface 101B of the substrate 101 to the etched surfaces of the front surface 101A and recovering such defects as dangling bonds that are formed by an etching process. To this end, in this embodiment, a hydrogen collecting material that covers the front surface 101A of the substrate 101 may be formed and a deuterium annealing process may be performed to induce the deuterium implanted from the rear surface 101B of the substrate 101 to be collected on the etched surfaces, that is, the surfaces of the isolation trench 102A and the trench 110, and to be bonded with silicon. After the annealing process is completed, a capping layer 130 including a hydrogen anti-diffusion material may be formed on the rear surface 101B of the substrate 101 so that the deuterium bonded with silicon may not be diffused into the exterior during the subsequent high-temperature process.

FIGS. 2A to 2J are cross-sectional views illustrating a method for fabricating a semiconductor device in accordance with an embodiment of the present disclosure.

Figure 2A:
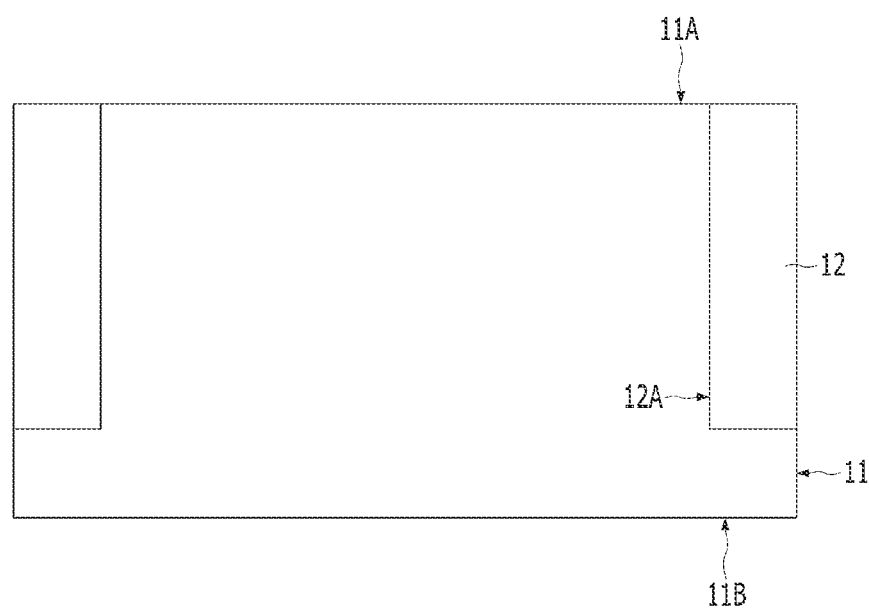
FIGS. 2A to 2J are cross-sectional views illustrating a method for fabricating a semiconductor device in accordance with an embodiment of the present disclosure.

Referring to FIG. 2A, as semiconductor processing proceeds, a semiconductor substrate 11 having a front surface 11A on which memory structures are formed and a rear surface 11B which is opposite to the front surface 11A may be prepared. Structures may be sequentially formed on the front surface 11A as semiconductor processing proceeds. Structures may not be formed on the rear surface 11B, but various material layers may be formed by a process for forming the structures. After the semiconductor processing is completed, a polishing process for reducing the thickness of the semiconductor substrate 11 may be performed on the rear surface 11B as necessary.

The semiconductor substrate 11 may be formed of a silicon-containing material. The semiconductor substrate 11 may include, for example, silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The semiconductor substrate 11 may include a III/V-group semiconductor substrate, for example, a compound substrate such as GaAs. The semiconductor substrate 11 may also include a silicon-on-insulator (SOI) substrate.

An isolation layer 12 may be formed in the semiconductor substrate 11. An active region 13 may be defined by the isolation layer 12.

The isolation layer 12 may be formed by a Shallow Trench Isolation (STI) process. For example, the semiconductor substrate may be etched to form an isolation trench 12A. Subsequently, the isolation trench 12A may be filled with a dielectric material to form the isolation layer 12. The isolation layer 12 may include, for example, silicon oxide, silicon nitride, or a combination thereof. A Chemical Vapor Deposition process or other deposition processes may be performed to fill the isolation trench 12A with a dielectric material. Also, a planarization process, such as a Chemical Mechanical Polishing (CMP) process, may additionally be performed to remove any excess dielectric material above the trench 12A and only fill the isolation trench 12A with the dielectric material.

Figure 2B:
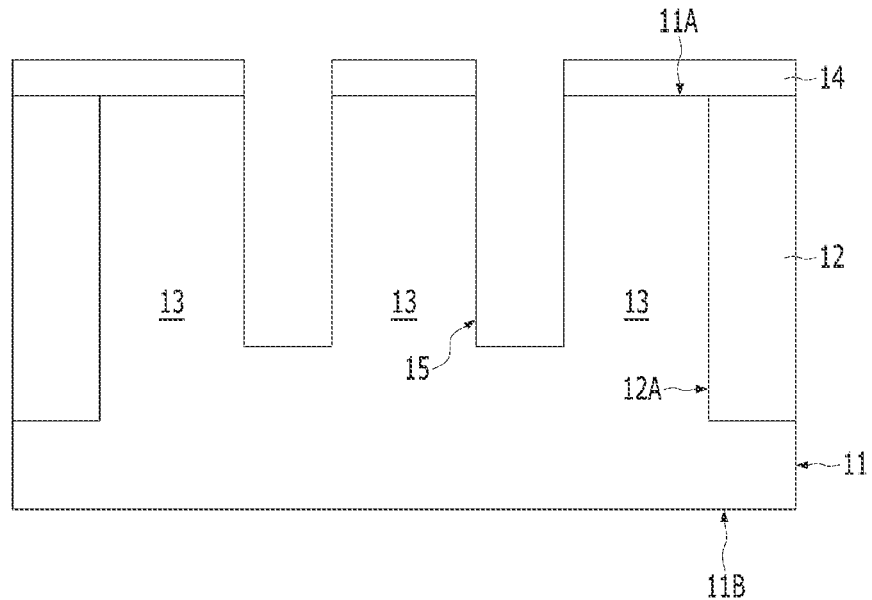

Referring to FIG. 2B, a hard mask layer 14 may be formed over the semiconductor substrate 11. The hard mask layer 14 may be formed to include a plurality of line-shaped openings corresponding to the region where the trenches 15 are to be formed. The openings may define a region in which the gate electrodes are to be disposed.

The hard mask layer 14 may be formed to expose a portion of the active region 13. Although not shown, the hard mask layer 14 may expose a portion of the isolation layer 12 disposed in the direction in which the openings defined by the hard mask layer 14 extends. The hard mask layer 14 may be referred to as an etch mask. The hard mask layer 14 may be formed of a material having an etch selectivity with respect to the semiconductor substrate 11. The hard mask layer 14 may include a dielectric material. The hard mask layer may include, for example, silicon oxide or silicon nitride.

Subsequently, a plurality of trenches 15 may be formed. In order to form the trenches 15, portions exposed by the hard mask layer 14 may be etched. That is, in order to form the trenches 15, the exposed portions of the active region 13 and the exposed portions of the isolation layer 12 may be etched. The trenches 15 may be formed to be shallower than the isolation trenches 12A. Each trench may have a sufficient depth to increase the average cross-sectional area of the subsequent gate electrode. Accordingly, the resistance of the gate electrode may be reduced. In an embodiment, a fin structure may be formed by selectively recessing the isolation layer 12 below the trench 15.

Figure 2C:
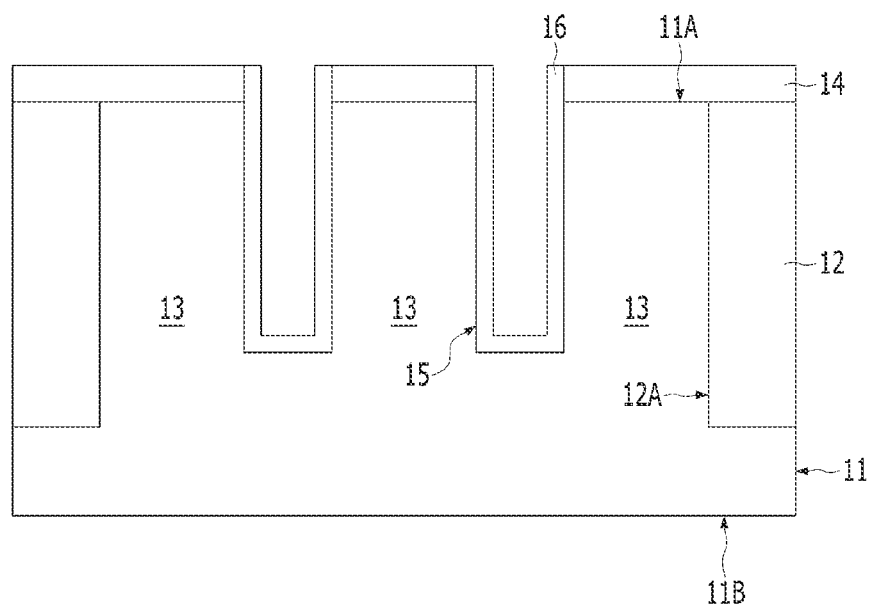

Referring to FIG. 2C, a gate dielectric layer 16 covering the bottom surface and sidewalls of the trench 15 and the sidewalls of the hard mask layer 14 may be formed. The gate dielectric layer 16 may include, for example, silicon oxide.

Figure 2D:
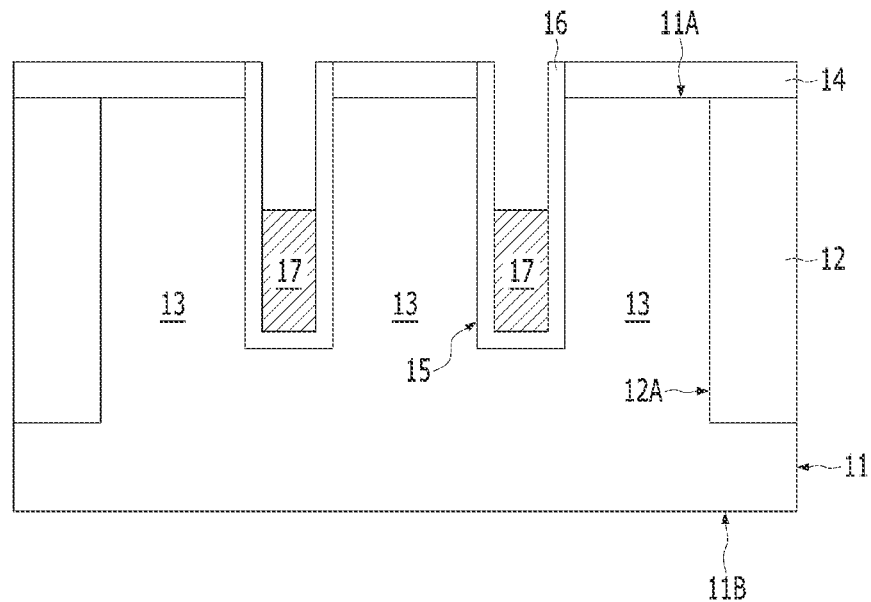

Referring to FIG. 2D, a gate electrode 17 filling the bottom portion of the trench 15 may be formed over the gate dielectric layer 16. The gate electrode 17 may include a conductive material. The gate electrode 17 may include a low-resistance metal. For example, the gate electrode 17 may include tungsten (W), titanium nitride (TiN), or a combination thereof. According to an embodiment, the gate electrode 17 may include a high work function material. For example, the gate electrode 17 may include a high work function metal or a high work function polysilicon. The high work function polysilicon may include P-type polysilicon. The high work function metal may include nitrogen-rich titanium nitride (Nitrogen-rich TiN). According to an embodiment, the gate electrode 17 may include a multi-layer structure having different work functions.

The gate electrode 17 may be formed by a series of processes including forming a conductive material over the gate dielectric layer to fill the trench 15, and performing a recess process such that the conductive material remains only in the bottom portion of the trench 15. The recess process may include a dry etching process, such as, for example, an etch-back process. The etch-back process may include using plasma.

According to an embodiment, the recess process may include performing a planarization process first so that the hard mask layer is exposed, and then performing an etch-back process.

Figure 2E:
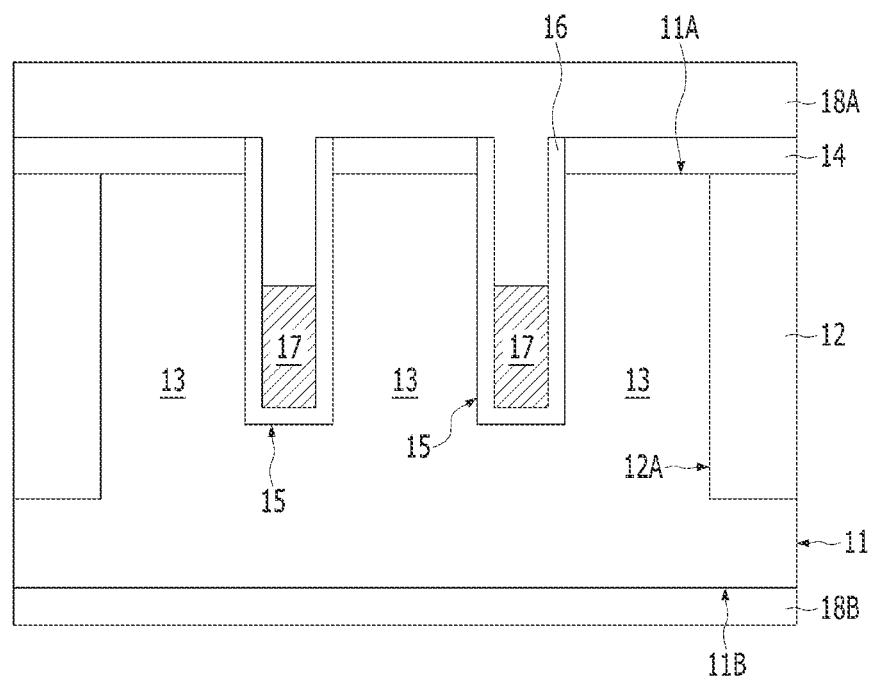

Referring to FIG. 2E, a sealing layer 18A and 18B including a first portion 18A that covers the gate electrode 17, the gate dielectric layer 16, and the front surface 11A of the substrate 11, and a second portion 18B that covers the rear surface 11B of the substrate 11, may be formed. The first portion 18A and the second portion 18B of the sealing layer may be formed simultaneously. The sealing layer 18A and 18B may include a hydrogen collecting material. The sealing layer 18A and 18B may include, for example, silicon nitride.

Figure 2F:
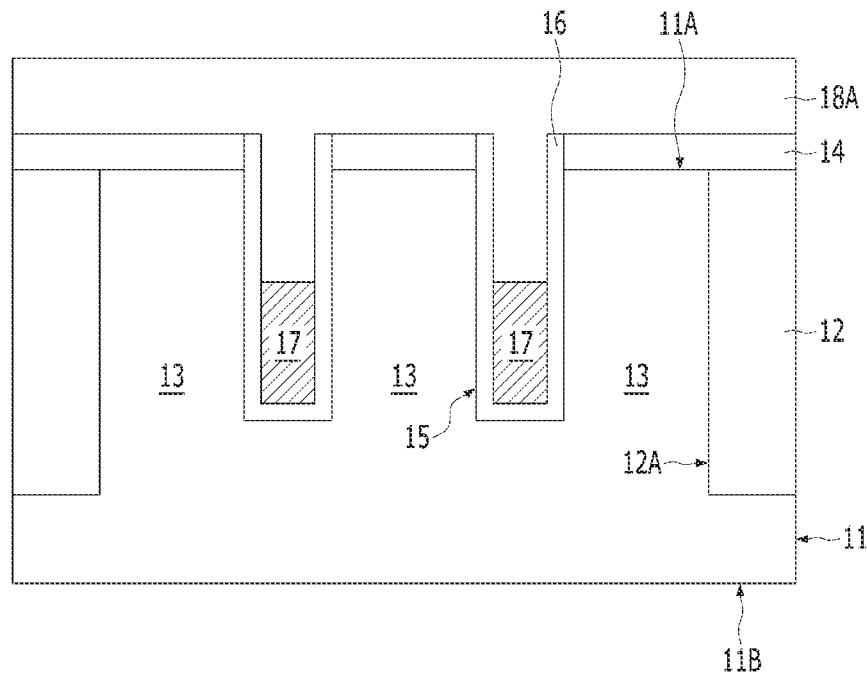

Referring to FIG. 2F, the second portion 18B of the sealing layer covering the rear surface 11B of the substrate may be selectively removed. The selective removal of the second portion 18B may be performed by a stripping process. By selectively removing the second portion 18B, the entire front surface 11A of the substrate may be covered with the first portion 18A of the sealing layer, and the rear surface 11B of the substrate may be exposed as it is.

Figure 2G:
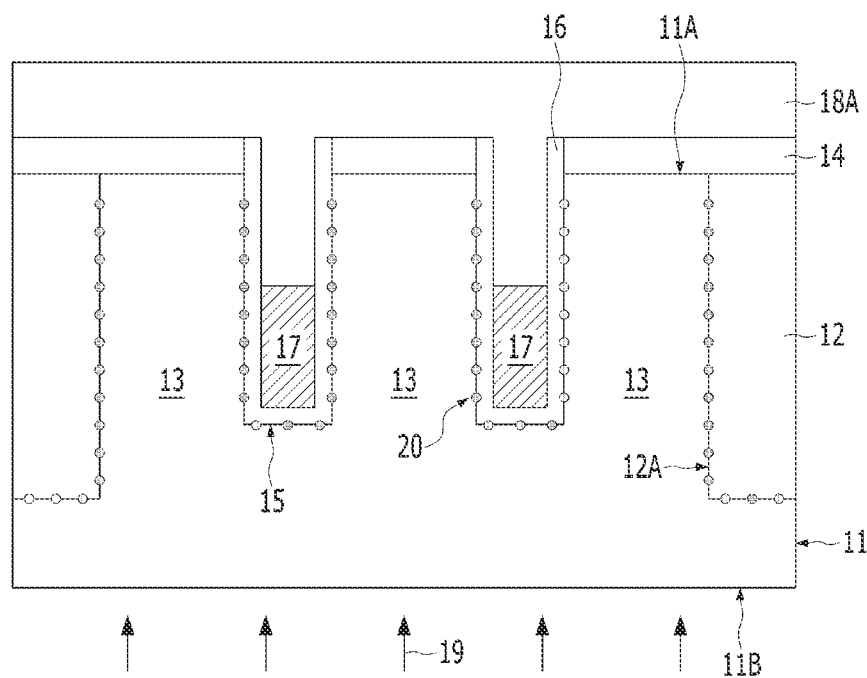

Referring to FIG. 2G, an annealing process 19 may be performed to form a hydrogen treated surface 20 at the interface between each trench 15 and the gate dielectric layer 16. The annealing process 19 may be performed in the atmosphere of deuterium. The annealing process 19 may be performed such that deuterium is implanted into the interface between each trench 15 and the gate dielectric layer 16 from the rear surface 11B of the substrate. The hydrogen treated surface 20 may also be formed on another etched surface of the front surface 11A of the substrate, that is, an interface between the isolation trench 12A and the isolation layer 12, through the annealing process 19.

According to the embodiment, such defects as dangling bonds formed by an etching process may be recovered by forming the first portion 18A of the sealing layer that covers the front surface 11A of the substrate and includes a hydrogen collecting material, exposing the rear surface 11B, and then performing an annealing process in the atmosphere of deuterium to induce the deuterium implanted from the rear surface 11B of the substrate to be collected on the etched surfaces of the front surface 11A of the substrate, that is, the interface between the trenches 15 and the gate dielectric layer 16 and the interface between the isolation trenches 12A and the isolation layer 12, and to be bonded with silicon.

Figure 2H:
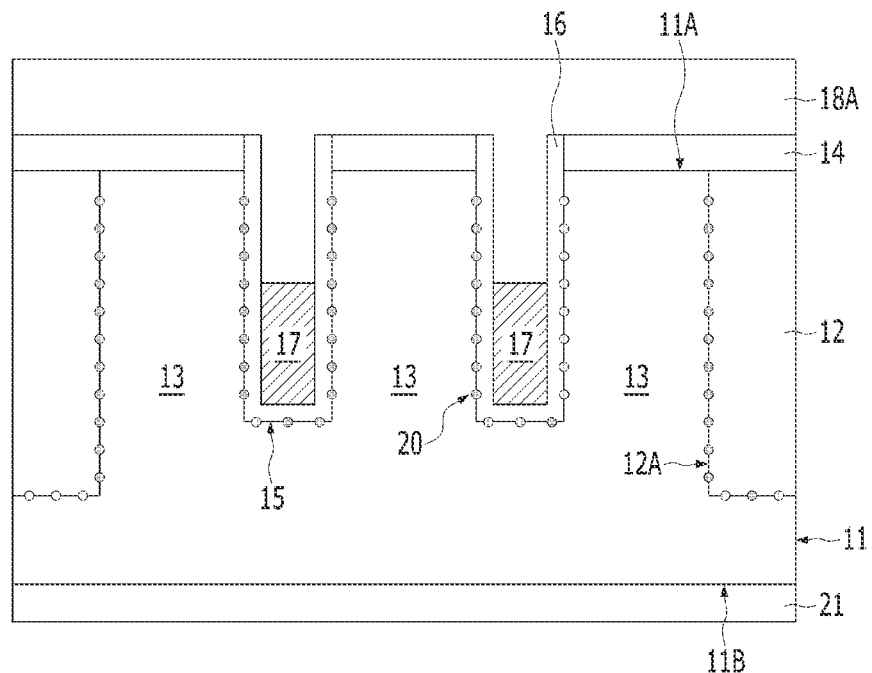

Referring to FIG. 2H, a capping layer 21 covering the rear surface 11B of the substrate may be formed. Although not illustrated, a capping layer (not shown) may be simultaneously formed on the front surface 11A of the substrate. The capping layer 21 may serve as a blocking film to prevent the deuterium bonded with silicon from being diffused into the exterior during the subsequent high-temperature processes. The capping layer 21 may include a hydrogen anti-diffusion material. For example, the capping layer 21 may include, for example, silicon nitride.

Figure 2I:
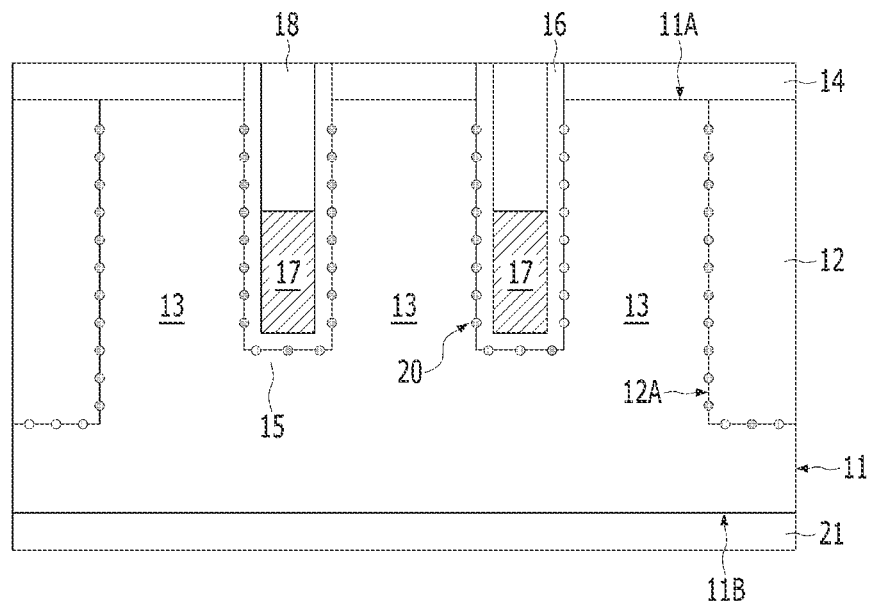

Referring to FIG. 2I, the gate sealing layer 18 may be formed by etching the first portion 18A of the sealing layer (see FIG. 2H). The gate sealing layer 18 may be formed to fill the remaining portion of each trench 15 over the gate electrode 17 which fills the bottom portion of the trench 15 and also over the gate dielectric layer 16 in the upper portion of the trench 15. The gate sealing layer 18 may be formed by planarizing the first portion 18A of the sealing layer. The planarization may be performed by a Chemical Mechanical Polishing (CMP) process or an etch-back process.

Figure 2J:
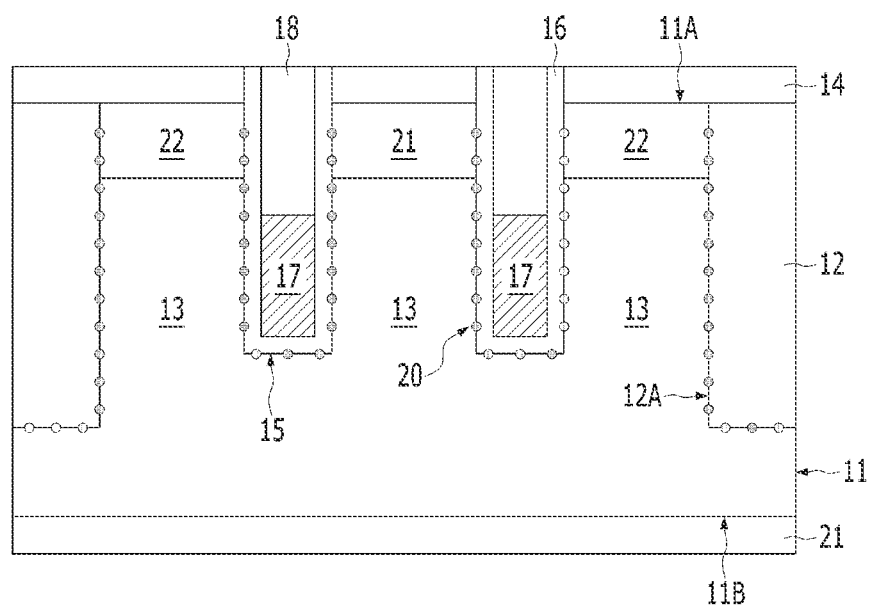

Referring to FIG. 2J, a first and second doped regions 21 and 22 may be formed in the active region 13 of the front surface 11A of the substrate on both sides of each trench 15. The first doped region 21 and the second doped region 22 may be formed by a doping process of an impurity by an implantation process or other doping techniques. The first doped region 21 may be formed between the buried gate electrode BG. The first doped region 21 may be referred to as a first source/drain region. The second doped region 22 may be formed between the isolation layer 12 and the buried gate electrode BG. The second doped region 22 may be referred to as a second source/drain region.

According to the embodiments of the present disclosure, the refresh characteristics of a semiconductor device may be improved through a surface treatment of a damaged substrate.

While the present invention has been described with respect to specific embodiments, it will be apparent to those skilled in the art that various changes and modifications may be made without departing from the spirit and scope of the invention as defined in the following claims.

What is claimed is:

1. A method for fabricating a semiconductor device, comprising:
   providing a substrate having a front surface and a rear surface opposite to the front surface;
   forming a trench in the front surface of the substrate;
   forming a gate dielectric layer over the trench;
   forming a gate electrode that fills a bottom portion of the trench over the gate dielectric layer;
   forming a sealing layer that includes a first portion covering the gate electrode, the gate dielectric layer, and the front surface of the substrate, and a second portion covering the rear surface of the substrate;
   selectively removing the second portion of the sealing layer;
   performing an annealing process to form a hydrogen treated surface on an interface between the trench and the gate dielectric layer; and
   forming a capping layer that covers the rear and front surfaces of the substrate, after the performing of the annealing process.

2. The method of claim 1, wherein the annealing process is performed in an atmosphere of deuterium.

3. The method of claim 1, wherein during the annealing process, deuterium is implanted from the rear surface of the substrate into the interface between the trench and the gate dielectric layer.

4. The method of claim 1, wherein in the forming of the sealing layer, the first portion and the second portion are formed simultaneously.

5. The method of claim 1, wherein the sealing layer includes a hydrogen collecting material.

6. The method of claim 1, wherein the sealing layer includes silicon nitride.

7. The method of claim 1, wherein the capping layer includes a hydrogen anti-diffusion material.

8. The method of claim 1, wherein the capping layer includes silicon nitride.

9. A method for fabricating a semiconductor device, comprising:
   providing a substrate having a front surface and a rear surface opposite to the front surface, the front surface including an etched surface;
   forming a sealing layer that includes a first portion covering the front surface of the substrate including the etched surface, and a second portion covering a rear surface of the substrate;
   removing the second portion of the sealing layer;
   performing an annealing process on the rear surface of the substrate to transform the etched surface of the substrate into a hydrogen treated surface; and
   forming a capping layer that covers the rear and front surfaces of the substrate, after the performing of the annealing process.

10. The method of claim 9, wherein the annealing process is performed in an atmosphere of deuterium.

11. The method of claim 9, wherein during the annealing process, deuterium is implanted from the rear surface of the substrate into the etched surface of the substrate.

12. The method of claim 9, wherein the etched surface of the substrate includes a trench.

13. The method of claim 9, wherein the etched surface of the substrate includes a channel of a transistor.

14. The method of claim 9, wherein the etched surface of the substrate includes an isolation trench in which an isolation layer is buried.

15. The method of claim 9, wherein in the forming of the sealing layer, the first portion and the second portion are formed simultaneously.

16. The method of claim 9, wherein the sealing layer includes a hydrogen collecting material.

17. The method of claim 9, wherein the sealing layer includes silicon nitride.

18. The method of claim 9, wherein the capping layer includes a hydrogen anti-diffusion material.

19. The method of claim 9, wherein the capping layer includes silicon nitride.

20. A method for fabricating a semiconductor device, comprising:
   providing a substrate having a front surface and a rear surface opposite to the front surface;
   forming a trench in the front surface of the substrate;
   forming a gate dielectric layer over the trench;
   forming a gate electrode that fills a bottom portion of the trench over the gate dielectric layer;
   forming a sealing layer that includes a first portion covering the gate electrode, the gate dielectric layer, and the front surface of the substrate, and a second portion covering the rear surface of the substrate;
   selectively removing the second portion of the sealing layer; and
   performing an annealing process to form a hydrogen treated surface on an interface between the trench and the gate dielectric layer,
   wherein the annealing process is performed with the rear surface of the substrate exposed.

* * * * *